United States Patent
Huang et al.

(10) Patent No.: US 8,525,258 B2
(45) Date of Patent: Sep. 3, 2013

(54) METHOD FOR CONTROLLING IMPURITY DENSITY DISTRIBUTION IN SEMICONDUCTOR DEVICE AND SEMICONDUCTOR DEVICE MADE THEREBY

(75) Inventors: Tsung-Yi Huang, Hsinchu (TW); Ying-Shiou Lin, Zhubei (TW)

(73) Assignee: Richtek Technology Corporation, R.O.C., Hsin-Chu (TW)

( * ) Notice: Subject to any disclaimer, the term of this patent is extended or adjusted under 35 U.S.C. 154(b) by 184 days.

(21) Appl. No.: 12/817,413

(22) Filed: Jun. 17, 2010

(65) Prior Publication Data

US 2011/0309443 A1 Dec. 22, 2011

(51) Int. Cl.
*H01L 29/66* (2006.01)

(52) U.S. Cl.
USPC ............ 257/336; 257/E29.261; 257/E21.435; 438/224

(58) Field of Classification Search
USPC ........... 257/336, E21.435, E29.261; 438/224
See application file for complete search history.

(56) References Cited

U.S. PATENT DOCUMENTS

| 5,864,167 A * | 1/1999 | Cutter ........................... 257/489 |
| 6,093,620 A * | 7/2000 | Peltzer .......................... 438/416 |
| 2002/0137292 A1* | 9/2002 | Hossain et al. ............... 438/289 |
| 2008/0157197 A1* | 7/2008 | Hsieh et al. ................... 257/339 |

* cited by examiner

*Primary Examiner* — Julio J Maldonado
*Assistant Examiner* — Sonya McCall Shepard
(74) *Attorney, Agent, or Firm* — Tung & Associates

(57) ABSTRACT

The present invention discloses a method for controlling the impurity density distribution in semiconductor device and a semiconductor device made thereby. The control method includes the steps of: providing a substrate; defining a doped area which includes at least one first region; partially masking the first region by a mask pattern; and doping impurities in the doped area to form one integrated doped region in the first region, whereby the impurity concentration of the first region is lower than a case where the first region is not masked by the mask pattern.

4 Claims, 4 Drawing Sheets

METHOD FOR CONTROLLING IMPURITY DENSITY DISTRIBUTION IN SEMICONDUCTOR DEVICE AND SEMICONDUCTOR DEVICE MADE THEREBY

BACKGROUND OF THE INVENTION

1. Field of Invention

The present invention relates to a method for controlling impurity density distribution in a semiconductor device, in particular to one that makes different regions have different impurity concentrations in the same doping process. The present invention also relates to a semiconductor device which is made by the method.

2. Description of Related Art

In manufacturing a semiconductor device, a doping process is often used to change the property of a semiconductor material so that it fits the requirements for device operation. Typically, a photolithography or self-align process is used to define a doped area, and an ion implantation process is performed to dope impurities. In the prior art, the implantation dosage and acceleration voltage within the same doping process are the same, and therefore, if there are different regions which require different doping concentrations, the only way is to perform another doping process to dope a different area defined by a different mask.

FIG. 1 shows, by cross-section view, a prior art laterally diffused metal oxide semiconductor device (LDMOS device), wherein the LDMOS device is formed by the following semiconductor processing steps: first, implanting N-type impurities into a substrate 11 by ion implantation to form an N-type buried layer 12; next, forming an epitaxial layer on the substrate 11; then, defining a pattern for P-type well regions 13, and doping P-type impurities in the epitaxial layer by ion implantation to form the P-type well regions 13; next, defining a pattern for N-type well regions 14, and doping N-type impurities in the epitaxial layer by ion implantation to form the N-type well regions 14; then, defining a pattern for a body region 16, and doping impurities in one of the P-type well regions 13 by ion implantation to form the body region 16; next, forming a shallow trench isolation (STI) region 15; then, defining patterns for P-type heavily doped regions 17 and N-type heavily doped regions 18 respectively, and doping N-type impurities and P-type impurities by ion implantation to form the P-type heavily doped region 17 and the N-type heavily doped region 18 respectively; Lastly, forming a gate structure 19. In the prior art mentioned above, because one single mask and one single ion implantation process are used to form the N-type buried layer 12, the impurity concentrations are the same in the region which contacts with the P-type well region 13 and the regions which contact with the N-type well region 14. The body region 16 is located in the P-type well region 13 which contacts with the N-type buried layer 12; in a normal operation mode of the LDMOS device, the body region 16 is coupled to a relatively high voltage, and thus breakdown may occur more easily between the P-type well regions 13 and the N-type buried layer 12 than in other regions.

With the reduction in the size and the increase in the operating voltage of the device, a higher breakdown voltage is required to prevent breakdown in the prior art mentioned above. Thus, according to some prior art, the dosage of ion implantation to form the N-type buried layer 12 is reduced, to provide a higher breakdown voltage. However, the contact resistance between the N-type buried layer 12 and the N-type well regions 14 would increase accordingly, and the effect of isolating the device and the substrate by the N-type buried layer 12 would be limited. The application of such device is also limited.

Besides the above, in some cases it may be required to implant a relatively low impurity concentration in making a semiconductor device, but due to hardware restriction of the ion implanter equipment, an ion beam with such low dosage can not be generated, and thus it is not possible to provide such low concentration implantation.

In view of the above, the present invention proposes a method for controlling impurity density distribution in a semiconductor device, and a semiconductor device which is made by the method to overcome the drawbacks in the prior art.

SUMMARY OF THE INVENTION

An objective of the present invention is to provide a method for controlling impurity density distribution in a semiconductor device.

Another objective of the present invention is to provide a semiconductor device.

To achieve the foregoing objectives, in one perspective of the present invention, it provides a method for controlling the impurity density distribution in a semiconductor device, the method comprising the steps of: providing a substrate; defining a doped area which includes at least one first region; partially masking the first region by a mask pattern; and doping impurities in the doped area to form one integrated doped region in the first region, whereby the impurity concentration of the first region is lower than a case where the first region is not masked by the mask pattern.

The foregoing method may further comprise: performing a diffusion step so that the impurities in the first region become one integrated doped region.

In one embodiment, the doped area further includes a second region which is masked by a pattern with a lower density compared to the pattern masking the first region, or which is not masked by any mask pattern (that is, the density of the pattern is 0), whereby the impurity concentration of the second region is higher than first region.

In the foregoing method, the mask pattern may be formed by a photoresist or a hard mask, and the doped area may be a buried layer or a deep well region.

In another perspective of the present invention, it provides a semiconductor device comprising: a substrate; a doped region in the substrate, wherein the doped region includes a first region and a second region with different impurity concentrations; a first well region which contacts with the first region in the substrate, wherein the first well region has the same conductivity type as the doped region; and a second well region which contacts with the second region in the substrate, wherein the second well region has the opposite conductivity type to the doped region; wherein the doped region is formed by a single doping step in which the first region and the second region are masked by patterns with different densities.

The foregoing semiconductor device may be, for example but not limited to, an LDMOS device or an ESD protection device.

The objectives, technical details, features, and effects of the present invention will be better understood with regard to the detailed description of the embodiments below, with reference to the drawings.

BRIEF DESCRIPTION OF THE DRAWINGS

FIGS. 2-5 show the first embodiment of the present invention by an LDMOS device with an N-type buried layer, wherein

DESCRIPTION OF THE PREFERRED EMBODIMENTS

The drawings as referred to throughout the description of the present invention are for illustration only, to show the manufacturing process and the interrelations between the layers, but not drawn according to actual scale.

The features of present invention include: to provide different impurity concentrations in different regions by one doping process, and to overcome the hardware limitation of the minimum implantation dosage by an implantation step with a higher dosage but forming a doped region with a lower concentration.

FIGS. 2-5 show an embodiment of present invention, wherein a laterally diffused metal oxide semiconductor device (LDMOS device) with N-type buried layer is used as an example to explain how to provide different impurity concentrations in different regions by one doping process, without any extra lithography or ion implantation step, such that the breakdown voltage of the LDMOS devices is increased while the contact resistance between the N-type buried layer 12 and the N-type well regions 14 is maintained.

Figure 2:
Figure 3:
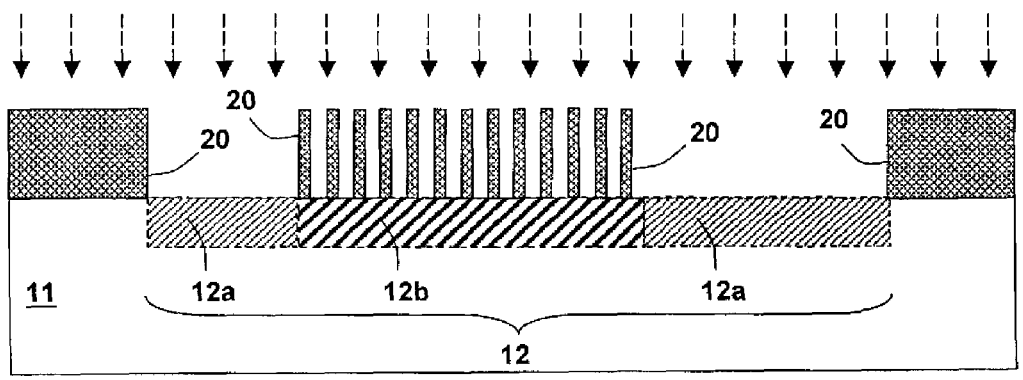

First, as shown in FIG. 2, a substrate 11 is provided, which is a silicon substrate for example. As shown in FIG. 3, after a photoresist pattern 20 is formed, an ion implantation step is taken (as shown by the arrows in FIG. 3), and an diffusion step is performed to form an N-type buried layer 12 which includes doped areas 12a and 12b. The photoresist pattern 20 does not fully open the area of the buried layer 12 but masks a certain ratio of the area (as shown in FIG. 3, the central part), to block the implantation of a certain amount of the impurity ions, whereby the buried layer area 12b with a lower concentration is formed under the mask pattern, and the buried layer area 12a with a relatively higher concentration is formed in the other areas not masked by the pattern. Although the buried layer area 12b is not fully subject to ion implantation, that is, some parts of the buried layer area 12b are not directly implanted with ions, in the following diffusion step, the buried layer area 12b becomes one integrated doped region as long as the pattern density is well arranged. According to the experiments by the inventor, no problem is found in electrical characteristics of the device. The diffusion step may be a natural ion diffusion occurring after the ion implantation, or an annealing step.

Figure 4A:
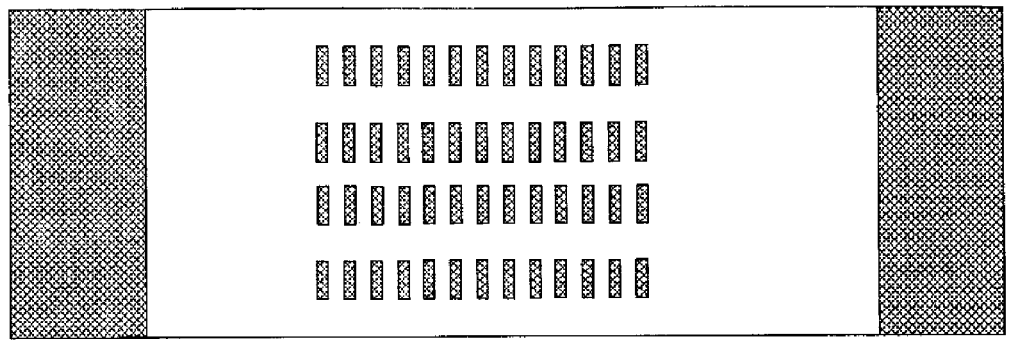
FIGS. 4A-4E show several examples of mask patterns by top view.
Figure 4B:
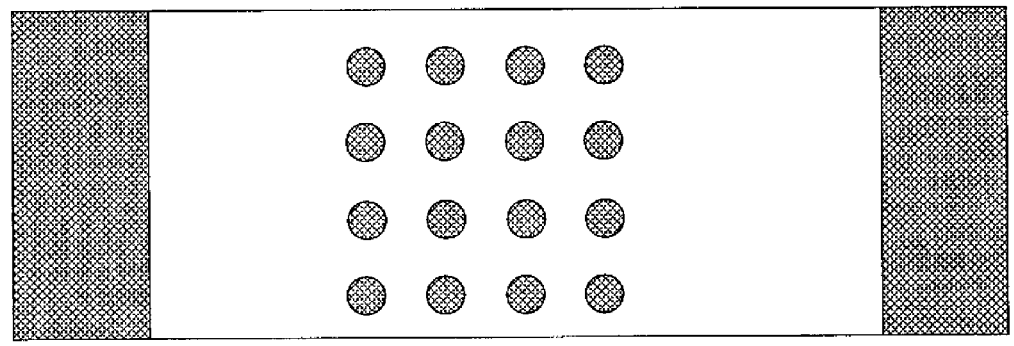
Figure 4C:
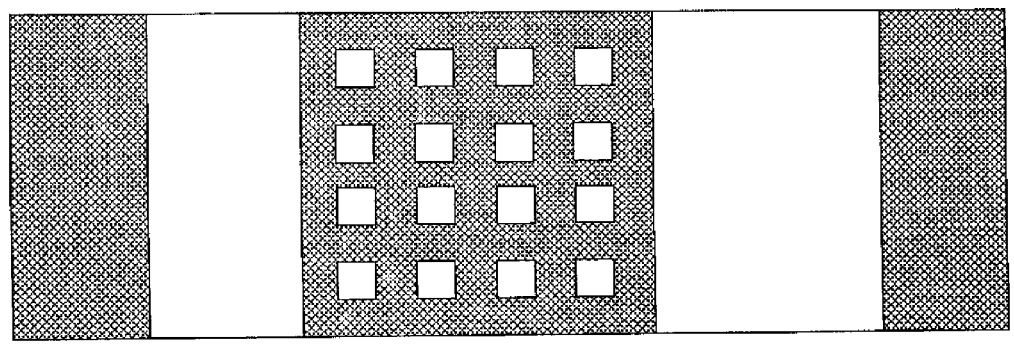
Figure 4D:
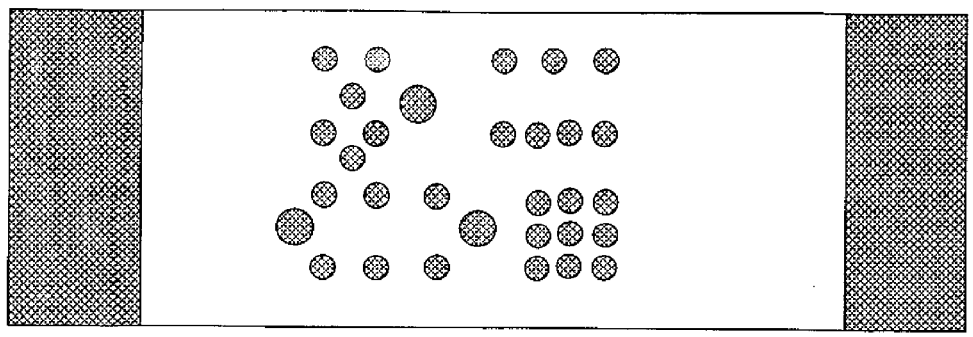
Figure 4E:
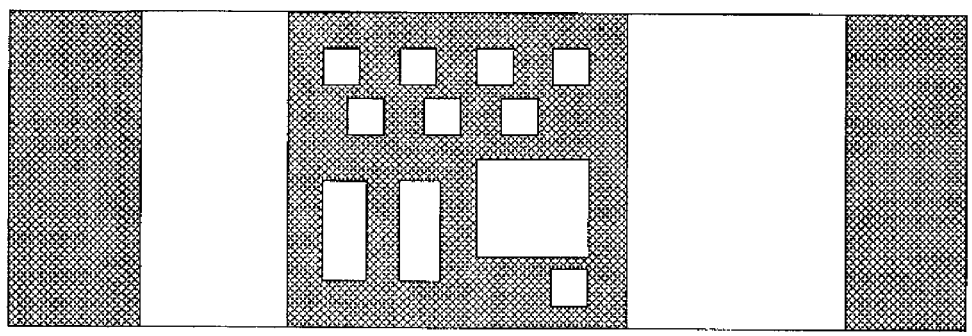

There is no limitation to the density, graphic arrangement or distribution of the mask pattern, as long as a uniform distribution of the impurities can be formed in the buried layer area 12b by the diffusion step after the ion implantation step. FIGS. 4A-4E show, in top view, several examples of the mask patterns; however, obviously, the present invention is not limited to these examples, and there are many other variations in the same spirit. The mask pattern may be a combination of rectangular maskings shown in FIG. 4A, or a combination of circular maskings shown in FIG. 4B, and it may also be a combination of any other polygon or irregular maskings. Besides, the mask pattern can be a combination of openings as shown in FIG. 4C. The maskings or openings can be distributed regularly as shown in FIGS. 4A-4C, or distributed irregularly as shown in FIGS. 4D and 4E, wherein the maskings or openings can be of the same size or not the same size.

Figure 1:
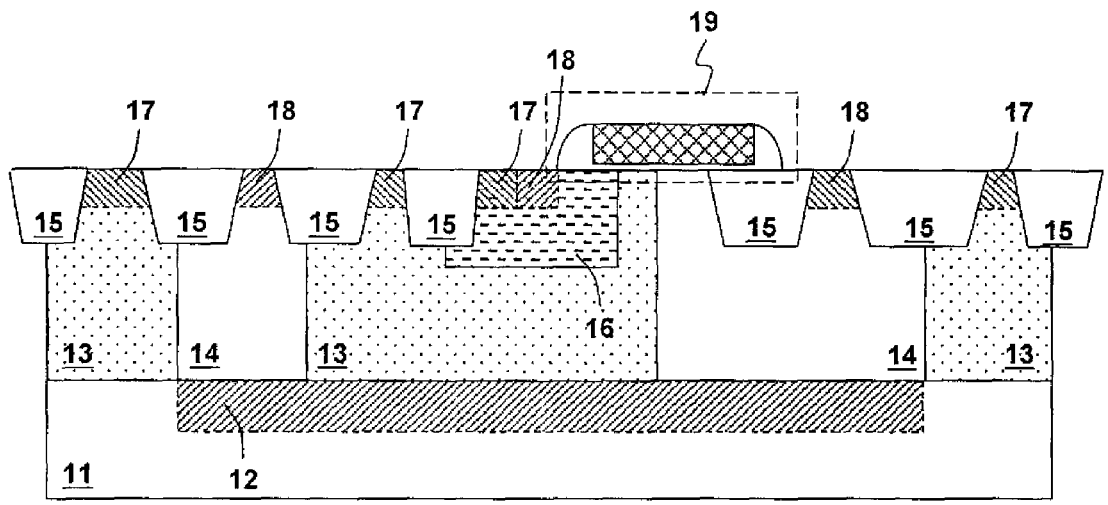
FIG. 1 illustrates, by cross-section view, a schematic diagram of a prior art LDMOS device.
Figure 5:
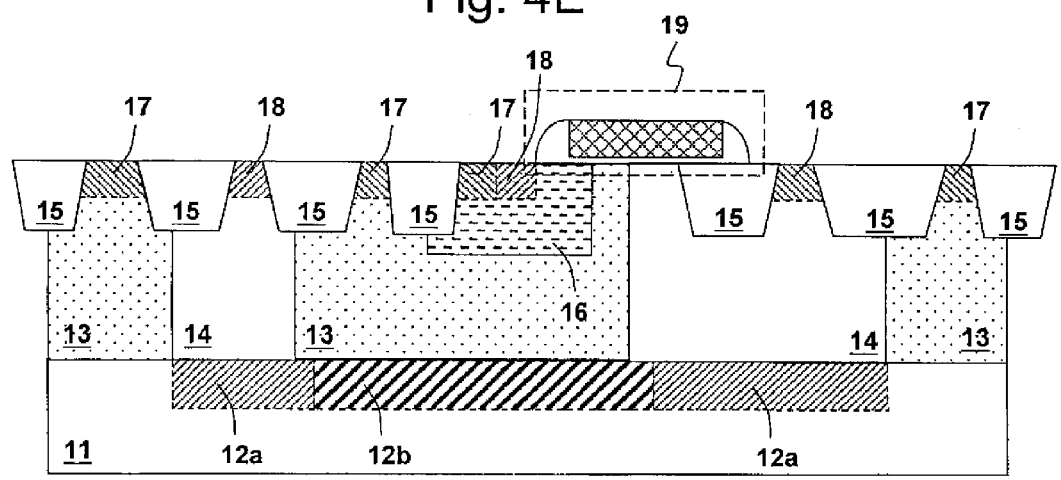

Next, as shown in FIG. 5, an epitaxial layer is formed on the substrate 11 by epitaxial growth, and by lithography, ion implantation, deposition, and etching, etc., the P-type well regions 13, N-type well regions 14, body region 16, STI regions 15, P-type heavily doped regions 17, and N-type heavily doped regions 18 are formed in the epitaxial layer; further, a gate structure 19 is formed on the epitaxial layer, to complete an LDMOS device similar to FIG. 1. However, compared with FIG. 1, there is a significant difference that the N-type buried layer area 12b under the body region 16 has a lower concentration, resulting in a higher breakdown voltage at the junction between the P-type well regions 13 and the N-type buried layer area 12b. Yet, the N-type buried layer areas 12a have a higher concentration as compared with the N-type buried layer area 12b, so the contact resistance between the N-type buried layer area 12a and the N-type well regions 14 is not increased.

Note that in this embodiment, it is not necessary for the N-type buried layer area 12b to be completely aligned with the P-type well regions 13 under the body region 16; it is only required for the part of the N-type buried layer under the P-type well regions 13 to have a lower impurity concentration so as to enhance the breakdown voltage. As shown in FIG. 5, the N-type "light" buried layer 12b does not completely overlap with the P-type well region 13 above it.

In this embodiment an LDMOS device containing an N-type buried layer and an epitaxial layer is shown as an example, but the same spirit of the present invention can be applied to a device which does not contain an epitaxial layer, and wherein the N-type buried layer is replaced by an N-type deep well.

According to the embodiment mentioned above, the present invention can be applied to an LDMOS device to enhance its breakdown voltage without changing the impurity concentration in other regions. However, the present invention should not be limited only to such application; in some case, the requirement is the opposite, that is, it is required to decrease the breakdown voltage without changing the impurity concentration in other regions, such as for an electrostatic discharge (ESD) protection device. In this case, a similar process as the above may be performed to make the impurity concentration of the region under the ESD protection device higher while other regions lower, by partially masking the other regions but fully opening the region under the ESD protection device during ion implantation. Thus, according to present invention, different regions with different impurity concentrations can be formed by one single mask and one single ion implantation process, for example to enhance the performance of ESD protection in a device, or to reduce the steps of the manufacturing process.

And, although the above-mentioned embodiment only describes to form regions with two different impurity concentrations, certainly, the same method is applicable to forming regions with three or more different impurity concentrations, by changing the densities of the mask patterns. In addition, in FIG. 3, the pattern fully opens the area above the buried layer area 12a, but of course, it can just partially open the area above the buried layer area 12a; that is, mask patterns are formed both above the buried layer areas 12a and 12b, but the density of the pattern above the buried layer areas 12a is lower while the density of the pattern above the buried layer area 12b is higher. From another viewpoint, the arrangement that there is no mask pattern above the buried layer areas 12a as shown in FIG. 3 can be taken as a special case, where the density is 0, among the arrangements that the density of the pattern above the buried layer areas 12a is lower than the density of the pattern above the buried layer area 12b.

Figure 6A:
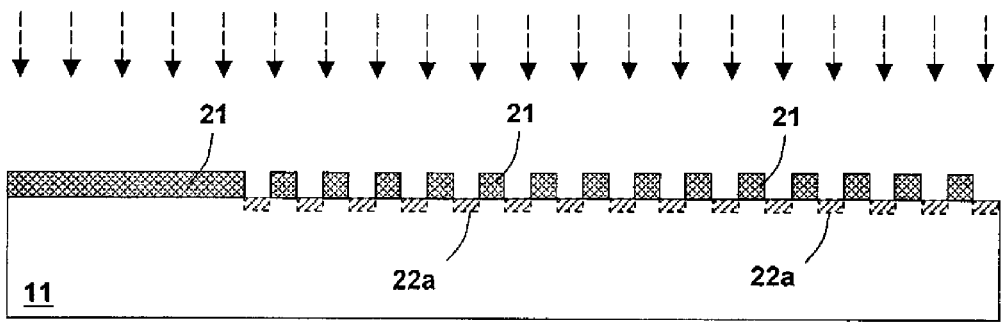
FIGS. 6A-6C show the second embodiment of the present invention, which illustrates how the present invention can overcome the hardware limitation of the minimum implantation dosage.
Figure 6B:
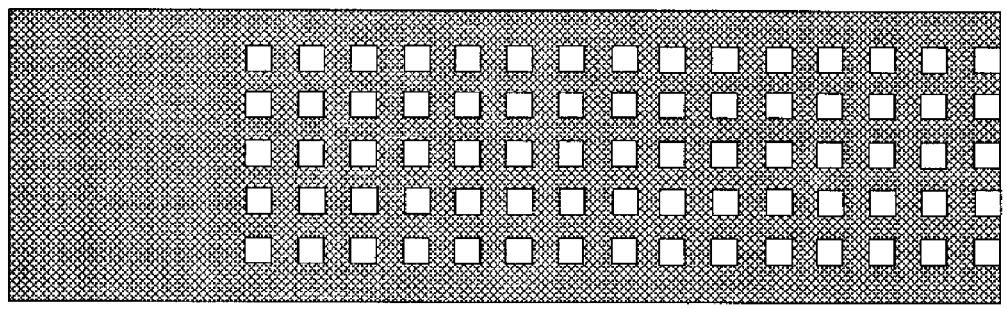
Figure 6C:
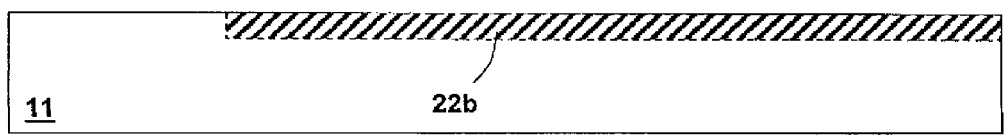

FIGS. 6A-6C show another embodiment of the present invention, for explaining how the present invention can be applied to achieving implantation below the minimum implantation dosage. In manufacturing semiconductor devices, it is often required to use an ion implanter to ionize a material containing impurities and to accelerate the impurity ions by applying electric and magnetic fields so that the impurity ions become ion beams and the ion beams are implanted into the devices. In the above mechanism for generating and controlling the ion beams, there is a limitation in the density and the current of the ion beams, and the present invention proposes a method to overcome the limitation of the hardware when the required implantation dosage is lower than minimum. FIG. 6A shows that a photoresist pattern 21 is formed above a lightly doped region, and an ion implantation process is performed afterward (as shown by the arrows in FIG. 6A), wherein the implanted region is partially masked from ion implantation by the photoresist pattern 21, so multiple doped regions 22a are formed. FIG. 6B shows the top view of FIG. 6A, wherein the ion beams go through the rectangular openings of the photoresist pattern 21 so that the impurities are implanted into the substrate 11. (Certainly, as described when referring to FIGS. 4A-4E, the photoresist pattern 21 can be of any other graphic arrangement.) FIG. 6C shows that the implanted substrate 11 is subject to a diffusion step such that the impurities become uniformly distributed and the originally separate doped regions 22a form one integrated lightly doped region 22b.

In the foregoing embodiments, photoresist is used as an example of the pattern mask. However, the material of the pattern mask is not limited to the photoresist; it can be any other material which can form a suitable mask, such as the materials which are often used to form a hard mask in the manufacturing process of the semiconductor devices, including but not limited to silicon dioxide, silicon nitride, silicon oxynitride, polysilicon, and metal, etc.

Besides, in the foregoing embodiments, ion implantation is used as an example because ion implantation is widely used for doping impurities in the current state of the art. However, the same spirit of the present invention can be applied to plasma immersion implantation as well.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the present invention should not be limited to forming N-type doped regions, but may be used to form P-type doped regions. As another example, as long as it does not affect the primary characteristics of the device, other process steps or structures, such as deep well region, can be added in the process or the device. As yet another example, in one implantation process, the shape or size of the mask pattern is not limited to be one, that is, there can be multiple shapes or different sizes of patterns concurrently formed on the substrate. Moreover, in one device, the present invention can be applied multiple times instead of just once, in one implantation process. Furthermore, the present invention is not limited to forming an LDMOS device, but may be used in forming any other semiconductor or optoelectronic device, such as diodes, photodiodes, bipolar transistors, junction transistors, or various metal oxide semiconductor devices, etc. Thus, the present invention should cover all such and other modifications and variations, which should be interpreted to fall within the scope of the following claims and their equivalents.

What is claimed is:

1. A semiconductor device comprising:
    a substrate having a doped region, wherein the doped region includes a first region and a second region with different impurity concentrations; and
    an epitaxial layer on the substrate such that the doped region becomes a buried layer, the epitaxial layer including:
        a first well region which contacts with the first region in the substrate, wherein the first well region has the same conductivity type as the doped region; and
        a second well region which contacts with the second region in the substrate, wherein the second well region has the opposite conductivity type to the doped region;
    wherein the doped region is formed by a single doping step in which the first region and the second region are masked by patterns with different densities; and
    wherein the second region has a lower or higher impurity concentration in comparison with the first region, to form a higher or lower breakdown voltage between the second well region and the second region in comparison with a case where the second region has the same impurity concentration as the first region.

2. The semiconductor device of claim 1, wherein the semiconductor device is an LDMOS device or an ESD protection device.

3. The semiconductor device of claim 1, wherein the density of the pattern for masking one of the first region and the second region is 0.

4. The semiconductor device of claim 1, wherein doped area is a buried layer or a deep well region.

* * * * *